United States Patent
Freidhof et al.

(10) Patent No.: US 8,046,182 B2
(45) Date of Patent: Oct. 25, 2011

(54) METHOD AND SYSTEM FOR DIGITAL TRIGGERING OF SIGNALS ON THE BASIS OF TWO TRIGGERING EVENTS SEPARATED BY A TIME DIFFERENCE

(75) Inventors: Markus Freidhof, Kirchseeon (DE); Johann Huber, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 196 days.

(21) Appl. No.: 11/997,074

(22) PCT Filed: Jun. 30, 2006

(86) PCT No.: PCT/EP2006/006368
§ 371 (c)(1),
(2), (4) Date: Jul. 3, 2008

(87) PCT Pub. No.: WO2007/012376
PCT Pub. Date: Feb. 1, 2007

(65) Prior Publication Data
US 2008/0270054 A1    Oct. 30, 2008

(30) Foreign Application Priority Data
Jul. 28, 2005   (DE) .......................... 10 2005 035 394

(51) Int. Cl.
*G01R 13/02*  (2006.01)
(52) U.S. Cl. ............... 702/67; 702/69; 702/71; 702/189
(58) Field of Classification Search .................... 702/66, 702/69, 71, 189; 324/76.12, 76.77; 375/226
See application file for complete search history.

(56) References Cited

U.S. PATENT DOCUMENTS

| | | | |
|---|---|---|---|
| 4,585,975 A | 4/1986 | Wimmer | |
| 4,785,415 A * | 11/1988 | Karlquist | ...................... 713/401 |
| 5,446,650 A | 8/1995 | Overhage et al. | |
| 5,854,996 A * | 12/1998 | Overhage et al. | .............. 702/189 |
| 6,263,290 B1 * | 7/2001 | Williams et al. | ................. 702/71 |
| 6,598,004 B1 * | 7/2003 | Ishida et al. | ..................... 702/69 |
| 6,621,913 B1 * | 9/2003 | de Vries | ......................... 382/100 |
| 6,753,677 B1 | 6/2004 | Weller et al. | |
| 2003/0220753 A1 | 11/2003 | Pickerd et al. | |

FOREIGN PATENT DOCUMENTS

| | | |
|---|---|---|
| DE | 39 36 932 A1 | 5/1990 |
| DE | 40 39 648 A1 | 7/1992 |
| EP | 0 215 515 A1 | 3/1987 |
| EP | 0 740 161 A2 | 10/1996 |
| WO | WO PCT/EP2006/006368 | 1/2006 |
| WO | WO PCT/EP2006/006368 | 9/2006 |

* cited by examiner

*Primary Examiner* — Mohamed Charioui
*Assistant Examiner* — Elias Desta
(74) *Attorney, Agent, or Firm* — Ditthavong Mori & Steiner, P.C.

(57) ABSTRACT

An approach is provided for digital triggering a recording of one or several signals sampled at individual sampling instants on a digital oscilloscope. The triggering is carried out when the interval between two recurrent triggering events is less or greater than a time threshold value.

18 Claims, 6 Drawing Sheets

METHOD AND SYSTEM FOR DIGITAL TRIGGERING OF SIGNALS ON THE BASIS OF TWO TRIGGERING EVENTS SEPARATED BY A TIME DIFFERENCE

BACKGROUND OF THE INVENTION

1. Field of the Invention

Embodiments of the invention relate to digital triggering of signals.

2. Discussion of the Background

A digital oscilloscope can now present analog signals very accurately on a display device after sampling the analog signal over time and digitize the sampled values of the analog signal at the individual sampling times by means of analog-digital conversion.

The triggering of the digitized signals to be presented on the display device of the digital oscilloscope is now also realized in digital manner. In the document DE 39 36 932 A1, an analog signal converted into the digital data format is compared in a comparator with reference to overshooting or undershooting a threshold value stored in a register. The first overshooting or undershooting of the threshold value by one of the sampled values of the analog signal to be presented is identified by the triggering system as a triggering time and leads to a triggering impulse, which is used in the display device for recording the signals to be presented synchronously with the triggering impulse.

The digital triggering of DE 39 36 932 A1 implements only a static triggering on the basis of a single signal-level comparison with one threshold value. The fact that a dynamic triggering on the basis of a time-dependent signal feature—for example, a triggering on the basis of a signal slope of the signal, a duration of a signal impulse or a time delay of a signal impulse by comparison with a reference impulse—is not yet possible using a digital triggering system of this kind is disadvantageous.

SUMMARY OF THE INVENTION

In accordance with various embodiments of the invention, a system and method are provided for digital triggering of signals, in which time-dependent signal features of the signal to be presented on the digital oscilloscope can be used as a triggering condition for a digital triggering, and of providing a corresponding digital oscilloscope.

Embodiments of the invention include a method for digital triggering, a system for digital triggering, and a digital oscilloscope.

According to an embodiment of the invention, a digital triggering of this kind, instead of one triggering event based upon one level comparison with one threshold value, as in the conventional art, two triggering events based upon two level comparisons each with one threshold value are identified, and the time difference between the two triggering events is used as the triggering condition for a dynamic triggering. The digital triggering is implemented in the case of an overshooting and also in the case of an undershooting of a threshold value by the time difference between the two identified triggering events. In this manner, a digital triggering is possible alternatively with a positive or negative signal slopes with a signal impulse up to a maximum impulse duration or from a minimum impulse duration or with a signal-impulse delay up to a maximum impulse delay or from a minimum impulse delay.

According to another embodiment of the invention, the time difference between the first and second triggering event is determined via the number of sampling times of the signals to be triggered between the two triggering events. On the one hand, as a result of the time discretization, a first inaccuracy in the precise determination of the first and second triggering events arises in the timing of the exact overshooting or undershooting of the threshold value by the time-discretized signal—reference signal—used in each case for the triggering; and, on the other hand, a second inaccuracy arises a result of a possible synchronicity error between the respectively-determined first or second triqgeritng event and the sampling raster of the signals to be presented on the digital oscilloscope.

The first inaccuracy, resulting from the imprecise determination of the first and second triggering events, is resolved by determining the levels of intermediate points between the last preceding sampling time and the next following sampling time of the reference signal(s) before and respectively after the first and second triggering event by means of interpolation, and by comparing the determined levels of the intermediate points with reference to overshooting or undershooting the threshold value(s). In this manner, the times of the first and second triggering events can be determined significantly more precisely.

The second inaccuracy resulting from the synchronicity error means that the occurrence of the triggering condition can be either unambiguously identified or unambiguously not identified or neither unambiguously identified nor unambiguously not identified. The triggering condition is unambiguously identified or unambiguously not identified, if the determined number of sampling times between the first and second triggering event either overshoots an upper threshold value or undershoots a lower threshold value. If the determined number of sampling times is disposed between the first and second triggering event between this upper and lower threshold value, then the occurrence of the triggering condition can neither be unambiguously identified nor unambiguously not identified. In this case, the display of the signals to be presented on the digital oscilloscope cannot be started via a triggering impulse and must be postponed until an unambiguous identification of the triggering condition.

In this approach, by way of an example, the individual sampled values of the signals to be presented on the digital oscilloscope must be buffered in a FIFO memory and the unambiguous occurrence or the unambiguous non-occurrence of the triggering condition are determined in a further, subsequent determination of the exact times of the first and second triggering events, and therefore of the exact time difference between the first and second triggering event if the presence of the triggering condition is identified in the fine analysis, the sampled values of the signals to be recorded, which have been buffered in the FIFO memory, are retrospectively presented on the display of the digital oscilloscope via a triggering impulse.

It should also be mentioned that, in the case of an overshooting of a threshold value, the upper and lower threshold values for the number of sampling times between the first and second triggering event for the unambiguous identification or unambiguous non-identification of the triggering condition adopt a different value—first lower and first upper threshold value—by contrast with the case of an undershooting of a threshold value—second lower and second upper threshold value. Additionally, the upper and lower threshold value for a threshold-value comparison of the time difference between the first and second triggering time with the ">=" or respectively "<=" inequality condition provides different values by contrast with a threshold-value comparison of the time difference between the first and second triggering time with the ">" or respectively "<" inequality condition.

According to yet another exemplary embodiment of the invention a method and the system are provided for the digital triggering of signals on the basis of two triggering events separated by a time difference, and the digital oscilloscope are explained in greater detail below with reference to the drawings.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION OF THE PREFERRED EMBODIMENTS

Figure 1:
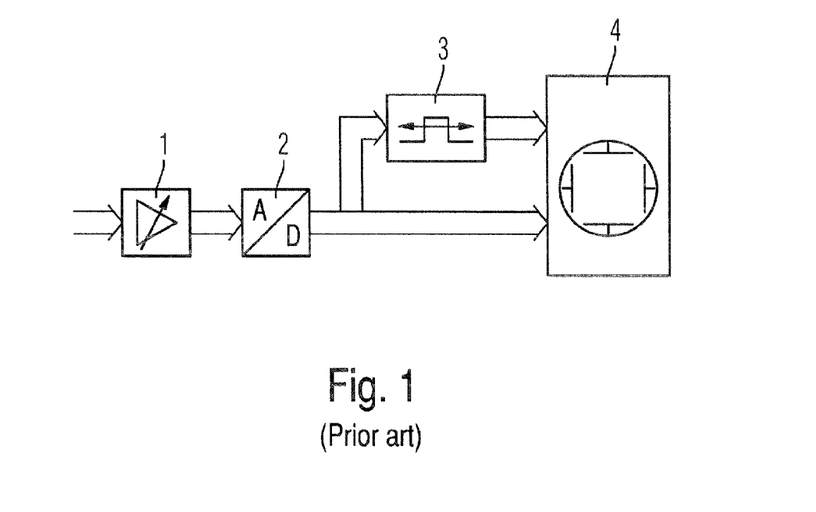
FIG. 1 shows a block-circuit diagram of a conventional digital oscilloscope.

Before describing the method and system for digital triggering of signals on the basis of two triggering events separated by a time difference with reference to FIGS. 2 to 7 and the associated digital oscilloscope, the digital oscilloscope according to the prior art will first be presented with reference to FIG. 1. This is necessary for the further understanding of the invention.

Using a pre-amplifier 1, which provides a variable amplification factor, the digital oscilloscope according to the prior art shown in FIG. 1 matches the level of the amplitudes of the measured signals present at its input with the measurement range of the display device 4. After the level matching, the pre-amplified, analog measured signals are supplied to an analog-digital converter 2 for conversion into a corresponding digital data format. The digitized measured signal is checked with reference to a triggering condition by a digital triggering system 3. If this triggering condition is identified, a triggering impulse for triggering the digital oscilloscope is generated at the output of the digital triggering system 3. The sampled values of the digitized measured signals, which are registered simultaneously with the triggering impulse or directly following the triggering impulse in time, are presented on the screen of the display unit 4 of the digital oscilloscope.

Figure 2:
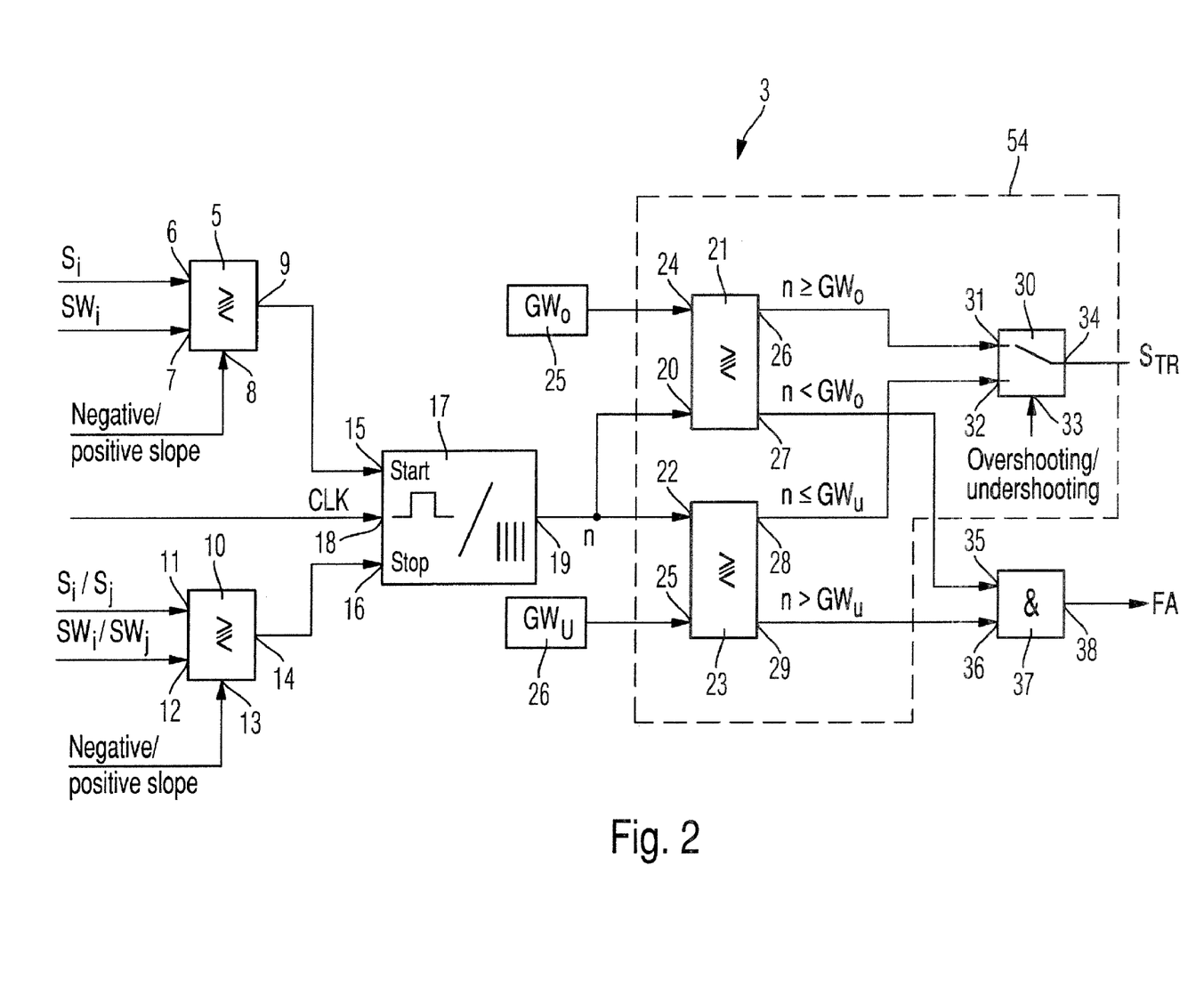
FIG. 2 shows a block-circuit diagram of a system for digital triggering of signals on the basis of two triggering events separated by a time difference, according to an exemplary embodiment of the present invention.

The system for digital triggering of signals on the basis of two triggering events separated by a time difference shown in FIG. 2 provides a first comparator 5 for the identification of a first triggering event. A first reference signal $S_i$ selected from all of the signals S to be presented on the digital oscilloscope is supplied to a first input 6 of the first comparator 5. A threshold signal $SW_i$, with which the first reference signal $S_i$ is compared in the first comparator 5 with reference to overshooting or undershooting, is disposed at the second input 7 of the comparator 5. The comparison with reference to overshooting or undershooting in the first comparator 5 is determined by the signal disposed at the third input 8, which indicates a comparison with regard to positive or negative slope. The output 9 of the first comparator 5 is activated in the case of an overshooting or undershooting of the threshold signal $Sw_i$ by the first reference signal $S_i$.

In a similar manner, a second comparator 10 is provided for the identification of a second triggering event following the first triggering event. Either the first reference signal $S_i$ supplied to the first input 6 of the first comparator 5 or a second reference signal $S_j$, which provides a time delay by comparison with the first reference signal $S_i$, is disposed at the first input 11 of the second comparator 10. The threshold signal present at the second input 12 of the second comparator 10 is either the threshold signal $SW_i$ also provided at the second input 7 of the first comparator 5 or a threshold signal $SW_j$, which differs from this threshold signal $SW_i$. The signal provided at the third input 13 of the second comparator 10 determines whether the threshold-value comparison in the second comparator 10 is to be implemented between the first reference signal $S_i$ or respectively the second reference signal $S_j$ and one of the two threshold signals $SW_i$ or $SW_j$ in the case of a positive or negative slope. The output 14 of the second comparator 10 is activated by the first or second reference signal $S_i$ or respectively $S_j$ in the case of an overshooting or undershooting of the threshold signal $SW_i$ or respectively $SW_j$.

Figure 5A:
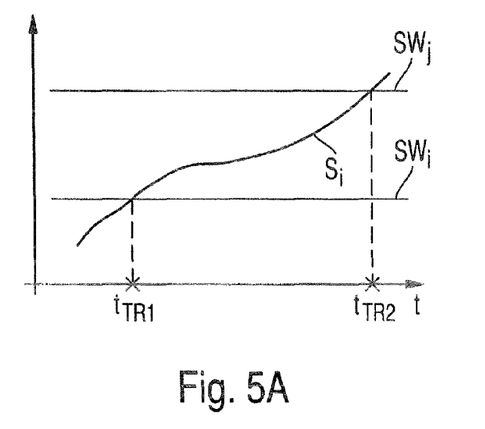
FIGS. 5A, 5B, 5C, 5D, 5E, 5F show time characteristics of various triggering conditions, according to various embodiments of the present invention.
Figure 5B:
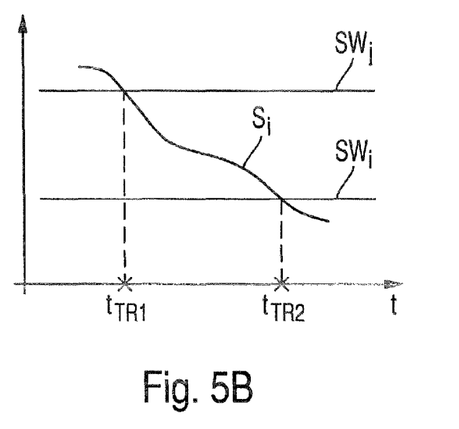
Figure 5C:
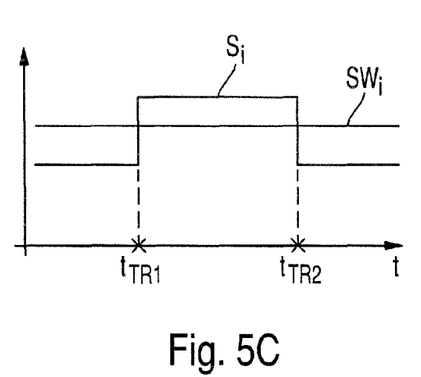
Figure 5D:
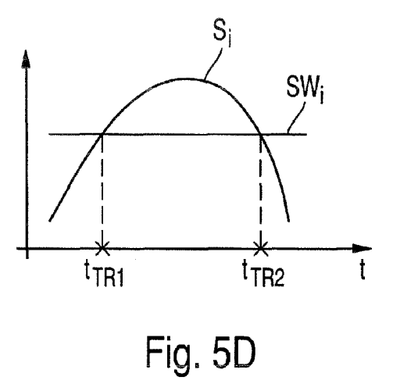
Figure 5E:
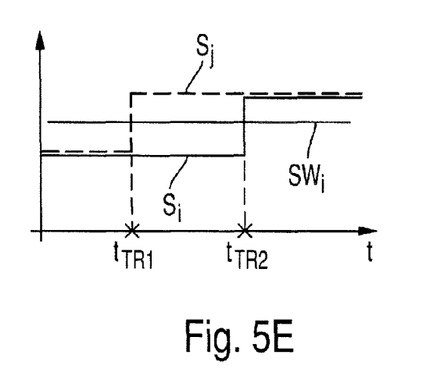
Figure 5F:
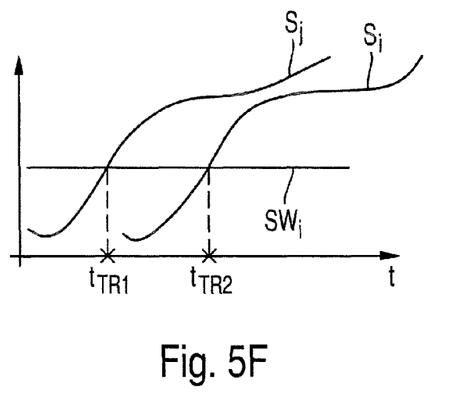

With the first comparator 5 and the second comparator 10, it is therefore possible, on the basis of two triggering events separated by a time difference—first and second triggering event—, to adjust and to identify the following substantial triggering conditions with reference to the first and respectively second reference signal $S_i$ and respectively $S_j$:

identification of a positive or negative slope with a given minimum or maximum gradient in a reference signal $S_i$ (FIG. 5A, 5B);

identification of a digital reference-signal impulse $S_i$ or an analog reference signal $S_i$ with a given minimum or maximum length (FIG. 5C, 5D); and identification of a signal delay with a given minimum or maximum delay at the start or at the end of the signal between a first reference signal $S_i$ and a second reference signal $S_j$ with a time delay relative to the first reference signal $S_i$ (FIG. 5E, 5F).

The output 9 of the first comparator 5 is supplied to the start-input 15, and the output 14 of the second comparator 10 is supplied to the stop-input 16 of the counter 17. The sampling frequency Clk of the analog-digital converter 2 of the digital oscilloscope is disposed at a third input 18 of the counter 17. The counter 17 counts the number n sampling times of the signals S to be presented on the digital oscilloscope between the first triggering event (output signal of the first comparator 5 disposed at the start-input 15 of the counter 17) and the second triggering event (output signal of the second comparator 10 disposed at the stop-input 16 of the counter 17).

The sampling times n counted by the counter 17 between the first and second triggering event at the output 19 of the counter 17 are supplied on the one hand to a first input 20 of a third comparator 21, and on the other hand, to a first input 22 of a fourth comparator 23. The second input 24 of the third comparator 21 receives the upper threshold value $Gw_o$ stored in a register 25. The second input 25 of the fourth comparator 23 is supplied with the lower threshold value $Gw_u$ stored in a register 26.

The first comparator 21 compares the number n, registered in the counter 17, of sampling times between the first and second triggering event with the upper threshold value $GW_o$ and activates the first; output 26 if the number n of sampling times is greater than or equal to the upper threshold value $GW_o$, and activates the second output 27, if the number n of sampling times is less than the upper threshold value $GW_o$. The fourth comparator 23 compares the number n, determined in the counter 17, of sampling times between the first and second triggering event with the lower threshold value $GW_u$ and activates the first output 28, if the number n of sampling times is greater than or equal to the lower threshold value $GW_u$, and activates the second output 29, if the number n of sampling times is less than the lower threshold value $GW_u$.

The definition of the registers 25 and 27 with upper and lower threshold values $GW_o$ and $GW_u$, for example, first and second upper threshold values $GW_{o1}$, $GW_{o2}$ and first and second lower threshold values $GW_{u1}$, $GW_{u2}$, is implemented by a superordinate process-control unit, not illustrated here, of the system for digital triggering of signals on the basis of two triggering events separated by a time difference. In this context, it should be stated that the occurrence of the triggering condition or the non-occurrence of the triggering condition cannot be unambiguously inferred from the number n, determined by the counter 17, of sampling times between the first and second triggering event; in fact, for given values of the number n of sampling times between the first and second triggering event, either the unambiguous occurrence or the unambiguous non-occurrence of the triggering condition must be determined retrospectively by a separate fine analysis.

This indeterminacy in the identification of the triggering conditions results from the inaccuracy n the exact determination of the first and second triggering events synchronicity errors between the sampling raster and the precise first or respectively second triggering event, the maximum value of which can be up to one sampling time, and from a lack of precision in the threshold-value comparison, which is determined by the use of ">=" or "<=" instead of a ">" or "<" as comparison operators. For these reasons, the upper and lower threshold value can differ by a maximum factor of three, and can accordingly determine up to two intervening values for the number n of sampling times between the first and second triggering event, for which neither an identification of the triggering condition is unambiguously present nor unambiguously not present. A superordinate process-control unit, which is not illustrated, of the system for digital triggering accordingly defines the registers 25 and 26 in agreement with the comparison operator—">=", "<=", ">" or "<" selected in the comparison of the time difference Δt between the first and second triggering event with the time threshold value $SW_t$ with respectively appropriate upper and lower threshold values $GW_o$ and $GW_u$.

The signal at the first output 26 of the third comparator 21—n≧$GW_0$—and the signal at the first output 28 of the second comparator 23—n≦$GW_u$—are each supplied to one of the two inputs 31 and 32 of a multiplexer 30. Dependent upon a signal disposed at a third input 33 of the multiplexer 30, which indicates an overshooting or undershooting of a specified time threshold $SW_t$ by the time difference Δt between the first and second triggering event, the multiplexer 30 connects either the activated signal of the first output 26 of the third comparator—n≧$GW_o$—in the case of an overshooting of the time threshold $SW_t$—or the activated signal of the first output 28 of the fourth comparator 23—n≦$GW_u$—in the case of an undershooting of the time threshold $SW_t$—through to the output 34 of the multiplexer 30, which acts as a triggering impulse $s_{TR}$ for triggering the signals S to be presented on the digital oscilloscope.

The third and fourth comparator 21 and 23, the associated registers 25 and 26 storing the upper and lower threshold value $GW_o$ and $GW_u$ and the multiplexer 30 therefore provide a unit 54 for the identification of triggering conditions.

The activated signal at the second output 27 of the third comparator 21—n<$GW_o$—and the activated signal at the second output 29 of the fourth comparator 23—n>$GW_u$—are supplied respectively to one of the two inputs 35 and 36 of an AND gate 37 and generate the signal FA for fine analysis of the triggering condition at the output 38. In this fine analysis, the sampled values of the reference signal(s) $S_i$ and respectively $S_j$ are evaluated in order to achieve a more-accurate determination of the first and second triggering events and therefore of the time difference Δt between the first and second triggering events. A subsequent threshold comparison of the precisely-determined time difference Δt between the first and second triggering event with a time threshold $SW_t$ allows an unambiguous identification or non-identification of the triggering condition.

Figure 3:
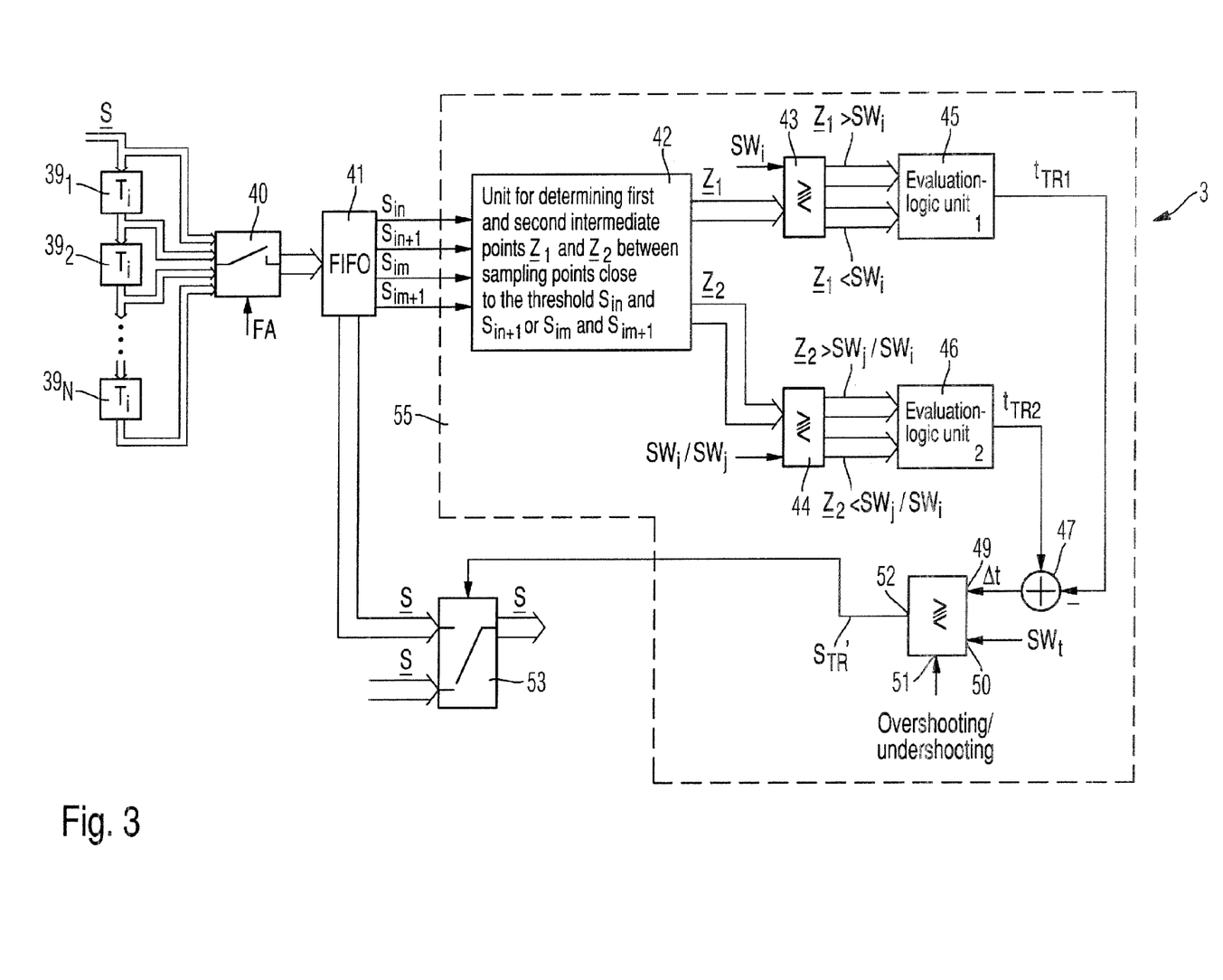
FIG. 3 shows a block-circuit diagram of a sub-system for fine analysis of triggering conditions, according to an exemplary embodiment of the present invention.

In the sub-system for the fine analysis of triggering conditions according to FIG. 3, the sampled values of the signals S to be presented on the digital oscilloscope are supplied to several delay elements $39_1$, $39_2$, ..., $39_N$ connected in series, in which they are delayed respectively by the sampling time $T_i$ of the analog-digital converter 2. The signals disposed at the individual outputs of the individual delay elements $39_1$, $39_2$, ..., $39_N$, which are each delayed relative to one another by a different number of sampling cycles $T_i$ and therefore represent the sampled values of the signals S to be presented on the digital oscilloscope, which have been buffered since the identification of the first triggering event, are supplied to the input of a switch 40 and passed on, in the case of an activated signal FA, for a fine analysis of the triggering condition to a first-in-first-out memory (FIFO memory) 41, in which they are buffered.

The last sampled value preceding the first identified triggering event and the next sampled value following the first identified triggering event, $S_{in}$ and $S_{in+1}$ respectively, of the first reference signal $S_i$, and the last sampled value preceding the second identified triggering event and the next sampled value following the second identified triggering event, $S_{im}$ and $S_{im+1}$ or respectively $S_{jm}$ and $S_{jm+1}$ of the first or respectively second reference signal $S_i$ and respectively $S_j$ are read out from the FIFO memory 41, by means of a process-control unit, which is not illustrated, of the system for digital triggering, and supplied to a unit 42 for determining the first and second intermediate points $Z_1$ and $Z_2$ between the sampled values close to the threshold value $S_{in}$ and $S_{in+1}$ together with $S_{im}$ and $S_{im+1}$ and respectively $S_{jm}$ and $S_{jm+1}$ of the first and respectively second reference signal $S_i$ and respectively $S_j$. The levels of intermediate points $Z_1$ and $Z_2$ are calculated in the unit 42 via a given interpolation method, which will not be explained in greater detail in present context, and supplied to a fifth and six comparator 43 and 44 for a more precise determination of the first and second triggering event.

A threshold-value comparison of the first intermediate points $Z_1$ with a threshold value $SW_i$ is implemented in the fifth comparator 43; while a threshold-value comparison of the second intermediate points $Z_2$ is implemented in the sixth comparator 44 with the same threshold value $S_i$ in the case of an identification of a signal impulse with a given impulse length or with a given signal delay; or with another threshold value $SW_j$ in the case of an identification of a signal slope.

The outputs $Z_1 > SW_i$ and $Z_1 < SW_i$ corresponding to the number of first intermediate points $Z_1$ provided respectively for an overshooting and an undershooting of the threshold value $SW_i$, which are activated respectively in the presence of the relevant comparison condition, are evaluated in a subsequent, first evaluation-logic unit 45 for the determination of the more-precise timing point $t_{TR1}$ of the first triggering event. Similarly, the outputs $Z_2 > SW_i$ and $Z_1 < SW_i$ or respectively $Z_2 < SW_i$ corresponding to the number of second intermediate points $Z_2$ provided respectively for an overshooting and an undershooting of the threshold value $SW_i$ and respectively $SW_j$, which are activated respectively in the presence of the relevant comparison condition, are evaluated in a subsequent second evaluation-logic unit 46 for the determination of the more-precise timing point $t_{TR2}$ of the second triggering event.

A subsequent subtraction element 47 calculates the time difference $\Delta t$ between the first and second triggering event from the difference between the timing point $t_{TR2}$ of the second triggering event and the timing point $t_{TR1}$ of the first triggering event. This time difference $\Delta t$ is supplied to a first input 49 of a subsequent seventh comparator 48 and compared with reference to overshooting or undershooting a time-threshold value $SW_t$ present at the second input 50. For this purpose, the signal present at the third input 33 of the multiplexer 30 is supplied to a third input 51 of the seventh comparator 48, which indicates a comparison with reference to an overshooting or undershooting of the time threshold $SW_t$. In the event of the comparison condition, a triggering impulse $s_{TR}'$, which delays the sampled values of the signals S to be displayed on the digital oscilloscope, which have been buffered since the occurrence of the first triggering event, in the FIFO memory 41, is activated at the output 52 of the seventh comparator 48 and passes on the evaluation time of the fine analysis instead of the currently pre-amplified and sampled signals S to the recording device 4 of the digital oscilloscope.

The unit 42 for determining the first and second intermediate points $Z_1$ and $Z_2$ between sampled points $S_{in}$, $S_{in+1}$, $S_{im}$, and $S_{im+1}$ close to the threshold, the fifth and sixth comparators 43 and 44, the first and second evaluation-logic units 45 and 46, the subtraction element 47 and the seventh comparator provide a unit 55 for fine identification of triggering conditions.

Figure 4:
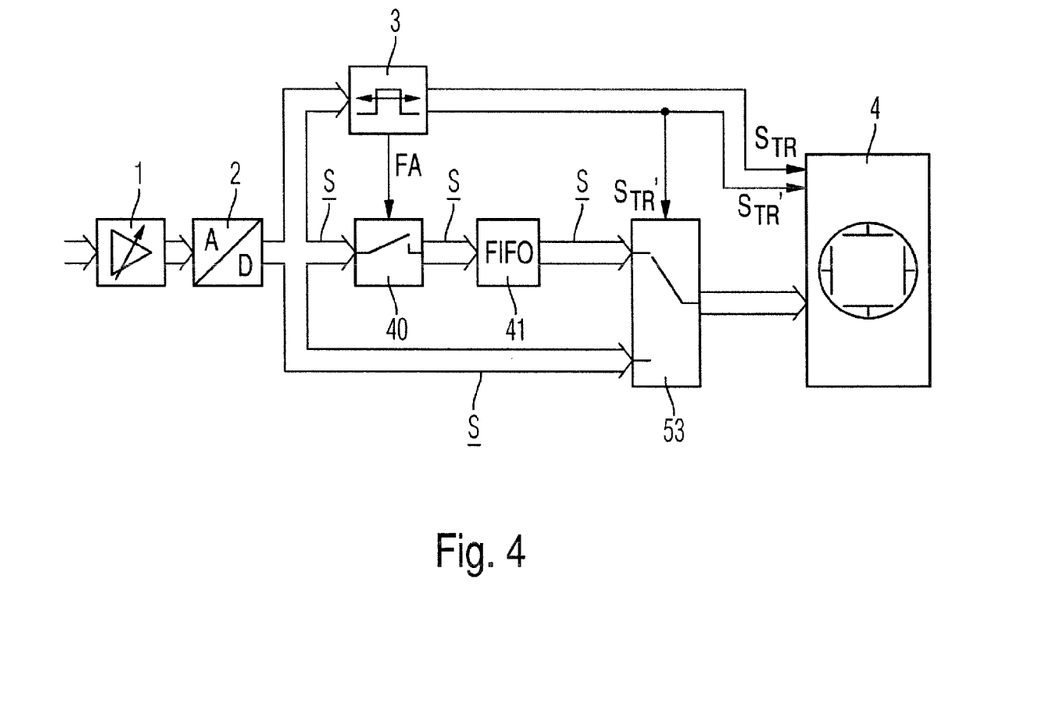
FIG. 4 shows a block-circuit diagram of a digital oscilloscope according to an exemplary embodiment of the present invention.

FIG. 4 shows the block-circuit diagram of the digital oscilloscope together with the functional units already presented in FIG. 3 with reference to the system for fine analysis of the triggering conditions. The description of these functional units is therefore not repeated at this point.

Figure 6:
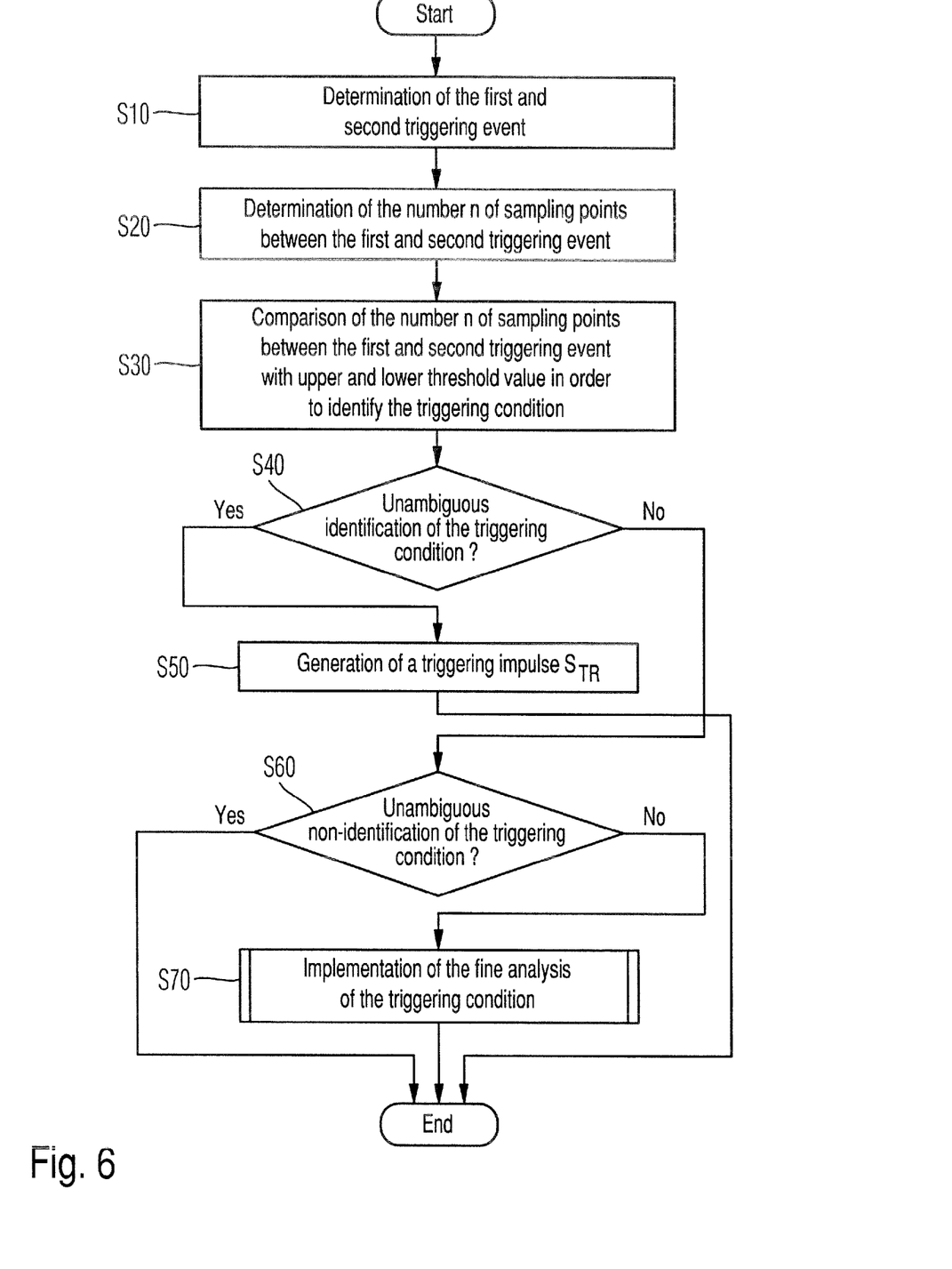
FIG. 6 shows a flow chart of a method for digital triggering of signals based on two triggering events separated by a time difference according to an exemplary embodiment of the present invention.

FIG. 6 presents the method for digital triggering of signals on the basis of two triggering events separated by a time difference.

In the first procedural stage S10, the first and second triggering events are determined by means of a first and second comparator 5 and 10 from a first reference signal Si selected from all of the signals S to be presented on the digital oscilloscope or from an additionally-selected second reference signal $S_j$ by means of a threshold-value comparison with a first threshold-value signal $SW_i$, or respectively, additionally, with a second threshold-value signal $SW_j$, with an accuracy corresponding to the level of the sampling periods of the signals S to be presented on the digital oscilloscope.

In procedural stage S20, using the first and second triggering event determined in procedural stage S10, the number ri of sampling times between the first and the second triggering event of the signals S to be presented on the digital oscilloscope are counted in a counter 17.

In procedural stage S30, the number n, determined in procedural stage S20, of sampling times between the first and second triggering event is compared with reference to overshooting or undershooting an upper and lower threshold value $GW_o$ and $GW_u$ in order to achieve an unambiguous identification or an unambiguous non-identification of the triggering condition. In this context, the upper and lower threshold values $GW_o$ and $GW_u$ corresponding to the comparison operators ">=", "<=", ">" or "<", which have been selected by the user or by the system for the threshold-value comparison of the time difference $\Delta t$ between the first and second triggering time, are selected by a superordinate process-control unit of the system for digital triggering.

If the threshold-value comparison of the number n of sampling times between the first and second triggering event provides an unambiguous identification of the triggering condition in procedural stage S40, a triggering impulse $s_{TR}$ for the triggering of the signals S to be presented on the digital oscilloscope is generated in the next procedural stage S50.

If the threshold-value comparison in procedural stage S60 also fails to provide an unambiguous non-identification of the triggering condition, a fine analysis of the triggering condition is implemented within the framework of a sub-routine S70, the purpose of which is to provide an unambiguous retrospective identification or an unambiguous retrospective non-identification of the triggering condition.

Figure 7:
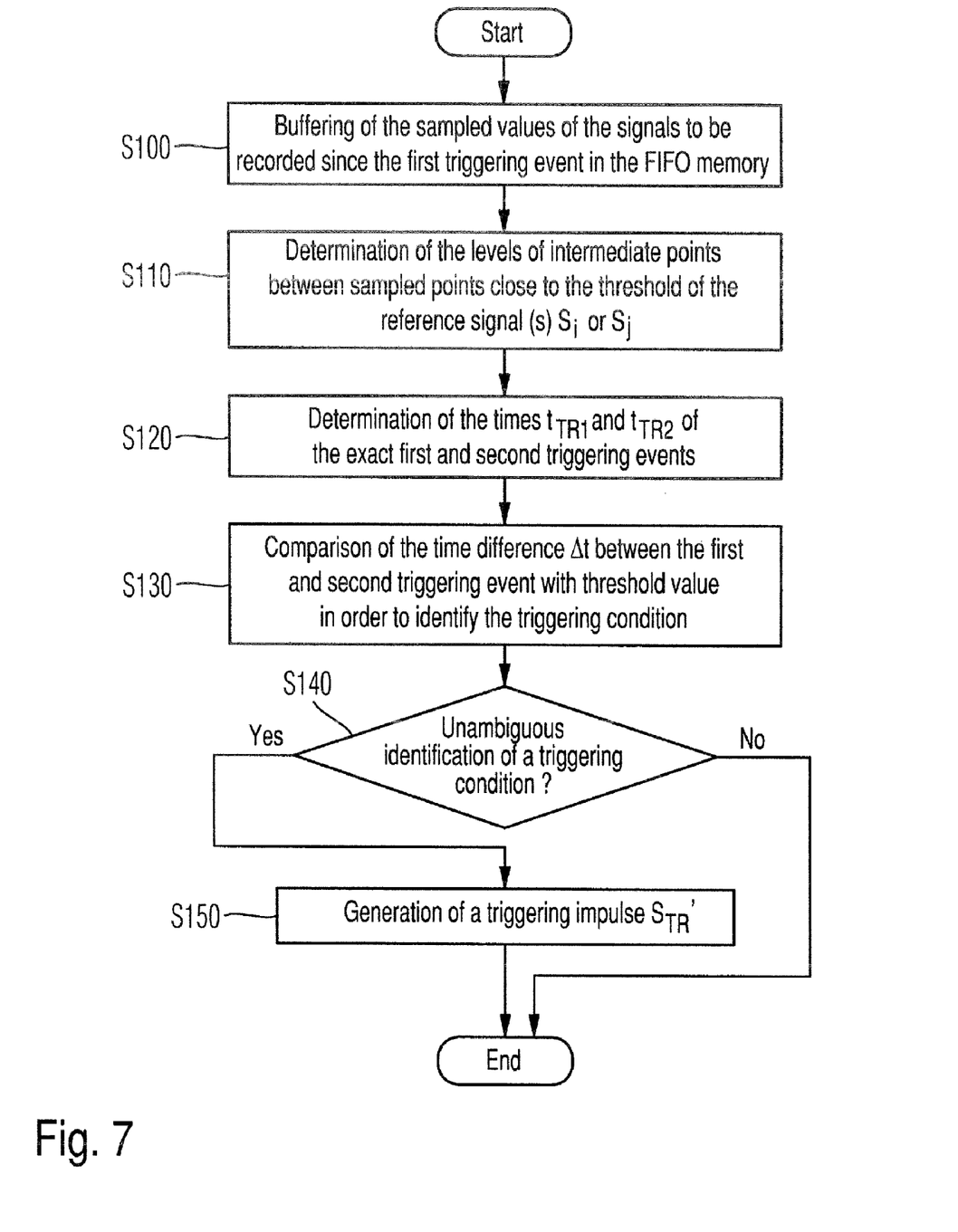
FIG. 7 shows a flow chart of a sub-routine for fine analysis of triggering conditions, according to an exemplary embodiment of the present invention.

The sub-routine for fine analysis of the triggering condition, which is executed within the method for digital triggering of signals on the basis of two triggering events separated by a time difference shown in FIG. 6 as procedural stage S70, is described in detail in FIG. 7.

The first procedural stage S100 of the sub-routine for fine analysis of the triggering condition illustrated in FIG. 7 provides the buffering of all sampled values of the signals S to be presented on the digital oscilloscope in a first-in-first-out memory 41 from the time of the identification of the first triggering event.

In the subsequent procedural stage S110, the levels of the first intermediate point $Z_1$, which are disposed between the last sampling time preceding the first triggering event and the next sampling time following the first triggering event of the first reference signal $S_i$, and the levels of the second intermediate point $Z_2$, which are disposed between the last sampling Lime preceding the second triggering event and the next sampling time following second triggering event of the first or second reference signal $S_i$ or $S_j$, are determined by means of an interpolation method.

In procedural stage S120, the timing points $t_{TR1}$ and $t_{TR2}$ of the first and second triggering event are determined in a fifth and sixth comparator 43 and 44 and a first and second evaluation-logic unit 45 and 46 by comparing the first and second intermediate values $Z_1$ and $Z_2$ with a threshold-value signal $SW_i$ or with an additional threshold-value signal $SW_j$.

In procedural stage S130 the time difference Δt between the first and second triggering event is determined in a subtraction element 47 on the basis of the determined timing points $t_{TR1}$ and $t_{TR2}$ of the first and second triggering event and, following this, compared in a seventh comparator 48 with reference to overshooting or undershooting a time-threshold value $SW_t$ in order to achieve an unambiguous identification of the triggering condition or an unambiguous non-identification of the triggering condition.

If an unambiguous identification of the triggering condition is present in procedural stage S140 as a result of the threshold-value comparison in procedural stage S130, a triggering impulse $s_{TR}'$ for triggering the sampling values of the signals S to be presented on the digital oscilloscope, which have been buffered in the FIFO memory 41 since the identification of the first triggering event, is generated in the final procedural stage S150.

The invention is not restricted to the embodiment illustrated. In particular, other numerical methods for the determination of more-precise timing points of the first and second triggering event, especially delay-time-optimised methods, are also covered by the invention.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

The invention claimed is:

1. A method comprising:
  digitally triggering a recording of one or more signals sampled at individual sampling times on a digital oscilloscope,
  wherein the digital triggering is implemented if the time difference between two occurring triggering events, which is determined from the number of sampling times between the two triggering events, overshoots or undershoots a time threshold,
  wherein an overshooting of the time threshold by the time difference is unambiguously identified, if the number of sampling times determined overshoots a first upper threshold, and the overshooting of the time threshold by the time difference is unambiguously not identified, if the number of sampling times determined undershoots a first lower threshold,
  wherein the undershooting of the time threshold by the time difference is unambiguously identified, if the number of sampling times determined undershoots a second lower threshold, and the undershooting of the time threshold by the time difference is unambiguously not identified, if the number of sampling times determined overshoots a second upper threshold, and
  wherein in the case of neither an unambiguous identification of an overshooting or undershooting of the time threshold by the time difference nor an unambiguous non-identification of an overshooting or undershooting of the time threshold by the time difference, the individual sampled values of the signals to be recorded on the digital oscilloscope are buffered and subjected to a subsequent fine analysis to determine if the time difference between the two triggering events overshoots or undershoots the time threshold.

2. The method according to claim 1, wherein
  at least one of the two occurring triggering events is an overshooting or an undershooting of one of several threshold values by one of several reference signals, which are selected from the signals to be recorded on the digital oscilloscope.

3. The method according to claim 1, wherein
  in the case of an unambiguous identification of the overshooting or undershooting of the time threshold by the time difference between the two triggering events, the recording of one or more signals on the digital oscilloscope is started.

4. The method according to claim 1, wherein
  the overshooting of the time threshold by the time difference between the two triggering events is neither unambiguously identified nor unambiguously not identified, if the number of sampling times determined is disposed between a first lower threshold value and the first upper threshold value.

5. The method according to claim 1, wherein
  the undershooting of the threshold value by the time difference between the two triggering events is neither unambiguously identified nor unambiguously not identified, if the number of sampling times determined is disposed between the second lower threshold value and a first upper threshold value.

6. The method according to claim 1, wherein,
  of the individual, buffered sampled values of the signals to be recorded on the digital oscilloscope, the buffered sampled values close to the threshold value of the selected first and second reference signals are subjected to a subsequent fine analysis.

7. The method according to claim 6, wherein
  in the fine analysis between the last sampling time preceding the first triggering event and the next sampling time following the first triggering event of the selected first reference signal, the levels of several first intermediate points are determined via interpolation at equidistant time intervals.

8. The method according to claim 6, wherein
  in the fine analysis between the last sampling time preceding the second triggering event and the next sampling time following the second triggering event of the selected first or second reference signal, the levels of several second intermediate points are determined via an interpolation at equidistant time intervals.

9. The method according to claim 8, wherein
  by comparing the levels of the first or respectively second intermediate points with reference to overshooting or undershooting one threshold value in each case, the first or respectively second intermediate point, which provides the shortest level difference relative to the associated threshold value, is identified as the first or respectively second triggering event.

10. The method according to claim 9, wherein
  the time difference between the first and second triggering event is compared with reference to overshooting or undershooting the time threshold.

11. The method according to claim 10, wherein
  dependent upon an overshooting or undershooting of the time threshold by the time difference between a first and second triggering event, the recording of the buffered sampled values of the signals to be presented on the digital oscilloscope is started on the digital oscilloscope.

12. A system for digital triggering of a recording of one or more digitized signals on a digital oscilloscope, with a digital triggering in the case of an overshooting or undershooting of a time threshold by a time difference between a first and a second occurring triggering event, comprising at least one comparator for the comparison of at least one of the reference signals selected from the signals to be recorded on the digital oscilloscope with reference to overshooting or undershooting at least one threshold value, and a unit for the identification of triggering conditions disposed downstream of the comparator, wherein the number of sampling times between the first and second occurring triggering events is determined, wherein an overshooting of the time threshold by the time difference is unambiguously identified, if the number of sampling times determined overshoots a first upper threshold, and the overshooting of the time threshold by the time difference is unambiguously not identified, if the number of sampling times determined undershoots a first lower threshold, wherein the undershooting of the time threshold by the time difference is unambiguously identified, if the number of sampling times determined undershoots a second upper threshold, and the undershooting of the time threshold by the time difference is unambiguously not identified, if the number of sampling times determined overshoots a second upper threshold, and wherein in the absence of both an unambiguous identification of a triggering condition by the unit for identification of triggering conditions and of an unambiguous non-identification of a triggering condition by the unit for identification of triggering conditions, a final unambiguous identification or a final unambiguous non-identification of a triggering condition is realized by another unit for fine identification of triggering conditions.

13. The system according to claim 12, wherein
a first reference signal is compared in a first comparator with a threshold value, in order to determine the first triggering event, and a first or second reference signal is compared in a second comparator in each case with reference to overshooting or undershooting one of the threshold values in order to determine the second triggering event.

14. The system according to claim 12, wherein
in order to determine the time difference between the first and second triggering event, the number of sampling times of the signals to be recorded between the first and second triggering event is counted in a counter .

15. The system according to claim 14, wherein
the overshooting or undershooting of the time threshold by the time difference between the first and second triggering event is implemented in the unit for the identification of triggering conditions by comparing the sampling times of the signals contained within the associated time difference to be recorded with an upper and lower threshold value.

16. The system according to claim 12, wherein
the unit for identification of triggering conditions realizes an unambiguous identification, an unambiguous non-identification or neither an unambiguous identification nor an unambiguous non-identification of the overshooting or undershooting of the time threshold by the time difference between the first and second triggering event.

17. The system according to claim 16, wherein
the sampled values of the signals to be recorded on the digital oscilloscope are buffered in a first-in-first-out-memory if an overshooting or undershooting of the time threshold by the time difference between the first and second triggering event is neither unambiguously identified nor unambiguously not identified by the unit for the identification of triggering conditions.

18. A digital oscilloscope comprising:
a pre-amplifier for level matching of at least one signal to be presented on the digital oscilloscope, an analog-digital converter for the analog-digital conversion of the signals to be presented, a system for digital triggering according to claim 16 and a recording unit for presenting the sampled signals to be recorded.

* * * * *